(12) United States Patent
Shen et al.

(10) Patent No.: US 7,642,854 B2
(45) Date of Patent: Jan. 5, 2010

(54) AMPLIFIER CIRCUIT HAVING AN OUTPUT TRANSISTOR FOR DRIVING A COMPLEX LOAD

(75) Inventors: Xianghua Shen, Unterhaching (DE); Markus Schimper, Moosinning (DE)

(73) Assignee: Infineon Technologies AG, Neubiberg (DE)

( * ) Notice: Subject to any disclaimer, the term of this patent is extended or adjusted under 35 U.S.C. 154(b) by 159 days.

(21) Appl. No.: 11/759,125

(22) Filed: Jun. 6, 2007

(65) Prior Publication Data

US 2008/0303596 A1    Dec. 11, 2008

(51) Int. Cl.
*H03F 3/04* (2006.01)
(52) U.S. Cl. ........................ 330/288; 323/315
(58) Field of Classification Search .................. 330/288
See application file for complete search history.

(56) References Cited

U.S. PATENT DOCUMENTS

| 3,952,257 | A | * | 4/1976 | Schade, Jr. | ................... 330/288 |
| 4,423,387 | A | * | 12/1983 | Sempel | ........................ 330/85 |
| 5,307,023 | A | * | 4/1994 | Schade, Jr. | ................... 330/257 |
| 6,011,415 | A | * | 1/2000 | Hahn et al. | .................. 327/103 |
| 6,714,081 | B1 | * | 3/2004 | Xu | ............................. 330/296 |

* cited by examiner

*Primary Examiner*—Henry K Choe
(74) *Attorney, Agent, or Firm*—Eschweiler & Associates, LLC

(57) ABSTRACT

An amplifier circuit is disclosed having an output transistor for driving a complex load over a drive frequency range, wherein in the lower part of the range an inductive component of the load dominates and in the upper part the inductive component does not dominate. The amplifier circuit includes a current mirror circuit that is connected upstream of the output transistor and has a shunt path to a second potential, for the purpose of relatively reducing a DC current flowing through the output transistor in comparison with an AC current flowing through the latter.

18 Claims, 6 Drawing Sheets

US 7,642,854 B2

AMPLIFIER CIRCUIT HAVING AN OUTPUT TRANSISTOR FOR DRIVING A COMPLEX LOAD

FIELD OF THE INVENTION

The invention refers to an amplifier circuit for use in audio appliances, for example.

BACKGROUND OF THE INVENTION

Amplifier circuits are usually used in audio technology, for example in Class AB feedback amplifiers. In this case, the quality of the amplifier decisively depends on the gain which is supplied to the signal and in turn depends on the load that is connected to the output.

FIG. 1 shows the schematic structure of a conventional 3-stage Class AB feedback amplifier which essentially comprises a first amplifier stage 1 which is supplied with the input signal and forwards the latter to a second amplifier stage 2 in amplified form. From the output of the second amplifier stage, the signal which has been amplified once again passes through a Class AB regulating system 3 which is required for the output stage amplifier 4 and is connected to the output stage amplifier 4 that forwards the signal to the output.

In the field of audio technology, the output is usually connected to a loudspeaker which represents a complex load and whose drive frequency range is represented by an inductive component in the lower frequency range and by a capacitive component in the upper frequency range. The components of a loudspeaker 5, formed by a series circuit comprising a resistor R and an inductance L with a capacitance C connected in parallel with the series circuit, are illustrated in FIG. 2. An audio amplifier having such a complex load constitutes a particular challenge since the load behaves differently in different frequency ranges and a particularly high gain is required.

Since the load behaves like a capacitance at high frequencies, the non-dominant pole which decisively contributes to the stability is decisively determined by the gain factor gm of the output stage. In order to ensure the stability of the AC component of the amplifier circuit in all frequency ranges, the gain factor must generally satisfy the condition $gm \gg 1/R$, where gm is the gain factor, also called the transconductance, and R is the resistance of the loudspeaker. In typical Class AB amplifier output stages, the gain factor can be specified by $gm = 2 \cdot Iq/(Vgs,eff)$, where Iq represents the quiescent current and Vgs,eff represents the effective gate-source voltage. The AC stability of the amplifier is thus decisively achieved by a large quiescent current Iq caused by the DC component.

FIG. 3 shows the equivalent circuit diagram of a conventional output stage amplifier, the quiescent current Iq being passed from the supply voltage Vdd to the output via the PMOS part which comprises a p-channel transistor P. In a complementary manner to the PMOS part, the output is connected to a ground potential via the one NMOS part which comprises an n-channel transistor N.

In these output stage amplifier circuits, the stability of signal amplification is ensured at the expense of an increased total current draw which mostly comprises the quiescent current.

BRIEF DESCRIPTION OF THE DRAWINGS

Advantages and expediencies of the invention transpire from the following description referred to the figures. Of these.

DETAILED DESCRIPTION OF THE INVENTION

Figure 1:
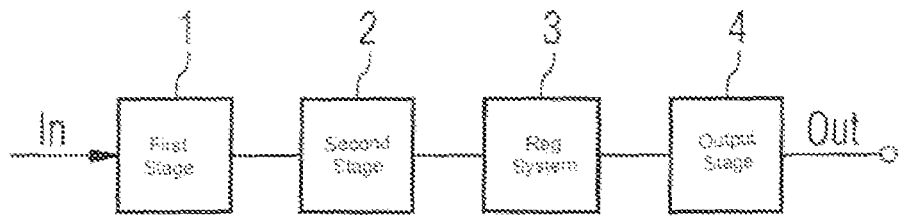
FIG. 1 shows a basic circuit diagram of a Class AB feedback amplifier.
Figure 2:
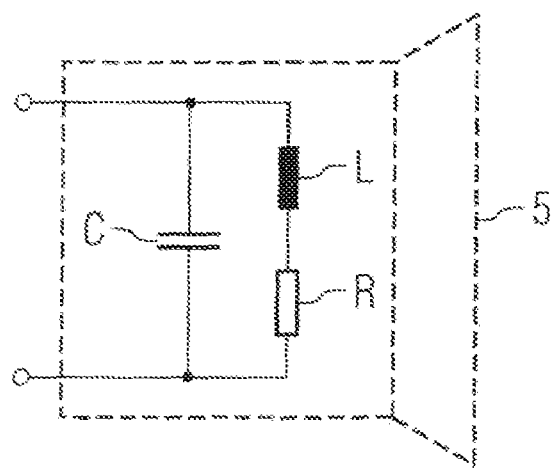
FIG. 2 shows an equivalent circuit diagram of a conventional loudspeaker.

The invention is directed to reducing the DC current flowing through the output transistor, wherein the output transistor is employed to retain or improve the gain of the AC component.

The invention includes the concept of an amplifier circuit in which the gain factor gm is intended to remain the same with a reduced DC component. The amplifier circuit accordingly has, in one embodiment, a current mirror circuit portion which is connected upstream of the output transistor and which has a shunt path to a second potential, thus achieving a relative reduction in a DC current flowing through the output transistor in comparison with an AC current flowing through the latter. In an alternative embodiment, the arrangement may also be characterized in such a manner that it has current sources or current sinks connected between the relevant potentials.

In one embodiment, the amplifier circuit is used in an audio output amplifier, in particular a Class AB audio output amplifier, for the direct connection of an electrodynamic loudspeaker.

In another embodiment, the current mirror circuit section which is integrated in the amplifier circuit has a first pre-output transistor and a second pre-output transistor and two pairs of current mirror transistors which are connected downstream of the pre-output transistors and connect the latter, one of the pairs of current mirror transistors comprising the output transistor to which the electrodynamic loudspeaker is connected.

One development of this embodiment is distinguished by the fact that the output transistor and the first pre-output transistor are in the form of a first and a second MOS transistor of a first conduction type, and the second pre-output transistor is in the form of a first MOS transistor of a second conduction type, and the current mirror section has a third MOS transistor of the first conduction type and a second and a third MOS transistor of the second conduction type.

In another embodiment, the amplifier circuit is distinguished by an additional component on a reference side of the current mirror portion that mirrors a high current while suppressing a proportional increase in a flow of current through the current mirror portion. The additional component of a second conduction type thus acts like a shunt path which branches some of the DC current flowing via the first pair of current mirror transistors.

In another embodiment, a cascode transistor whose source or emitter potential controls a switching function of the third MOS transistor of the first conduction type is connected between the pairs of current mirror transistors. In this embodiment, the cascode transistor is in the form of a fourth transistor of the first conduction type with a fixed gate voltage, the source potential of which is conducted to the gate of the third MOS transistor of the first conduction type using a connecting line.

Further embodiments comprise the design as an output portion of a multistage Class AB amplifier circuit and the design as an output section of a multistage feed forward amplifier circuit.

Figure 4:
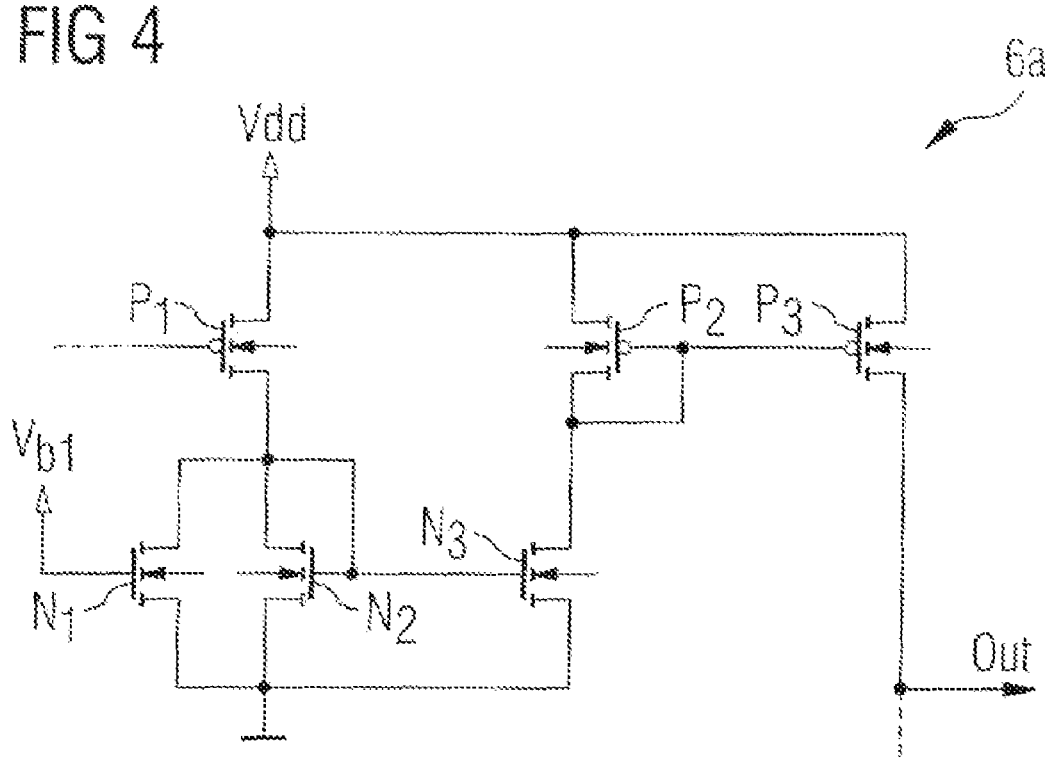
FIG. 4 shows a schematic illustration of the PMOS part of an output stage amplifier according to one embodiment of the invention.

FIG. 4 shows the schematic illustration of the output stage amplifier circuit according to one embodiment of the invention. The structure comprises a supply voltage Vdd which is connected to the source contact of a pre-output transistor P1 and to the source contacts of a pair of current mirror transistors P2 and P3, the transistor P3 of the second pair of current mirror transistors representing the output transistor. The transistors P1 to P3 are transistors of a first conduction type. In this embodiment, this pair of transistors is referred to as the second pair of current mirror transistors.

The signal arriving at the gate contact of the transistor P1 is forwarded to a first pair of current mirror transistors N2-N3, the drain contact of the transistor P1 being connected to the drain contact of the transistor N2. The transistor N2 of the first pair of current mirror transistors has a shunt path which connects the drain contact of the transistor N2 to the gate contact of the transistor N2 and N3, thus mirroring the applied signal to the transistor N3.

A further transistor N1 which has a fixedly set gate voltage Vb1 and whose drain contact is connected to the drain contact of the transistor P1 is connected in parallel with the pair of current mirror transistors N2-N3. The source contacts of the transistors N1, N2 and N3 of a second conduction type are connected to the ground potential.

The signal which is mirrored by the first pair of current mirror transistors N2-N3 is transmitted, via the drain contact of the transistor N3, to the transistor P2 which controls the transistor P3 via a shunt path which connects the gate contacts of the transistors P2 and P3 to the drain contacts of the transistors N3 and P2. The signal which has thus been mirrored again is passed to the output via the drain contact of the output transistor P3.

Figure 5:
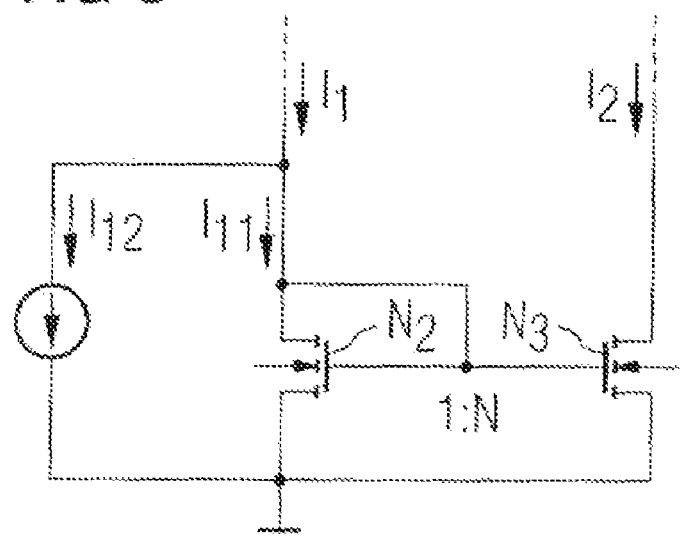
FIG. 5 shows a schematic illustration of the first pair of current mirror transistors with the gain ratio 1:N.

FIG. 5 shows a detailed extract from FIG. 4, in which only the first pair of current mirror transistors is depicted with the additional component (e.g., N1 in one embodiment) which is connected in parallel. I1 denotes the signal which comes from the pre-output transistor P1 and is composed of a DC component and an AC component. The transistor N1 of the second conduction type which is depicted in FIG. 4 and has a fixedly set gate voltage Vb1 acts like a current source, as shown in FIG. 5. This means that the signal coming from the transistor P1 is divided into the component I11, which is supplied to the pair of current mirror transistors, and the component I12 which is discharged to the ground potential.

The advantage of this output stage amplifier circuit according to the invention is that the DC component and AC component are not divided but rather only the DC component flowing into the first current mirror is reduced. This results in the entire AC component of the input signal and only part of the DC signal being amplified and transferred to the next pair of current mirror transistors P2-P3 when mirroring from transistor N2 to N3.

Figure 6:
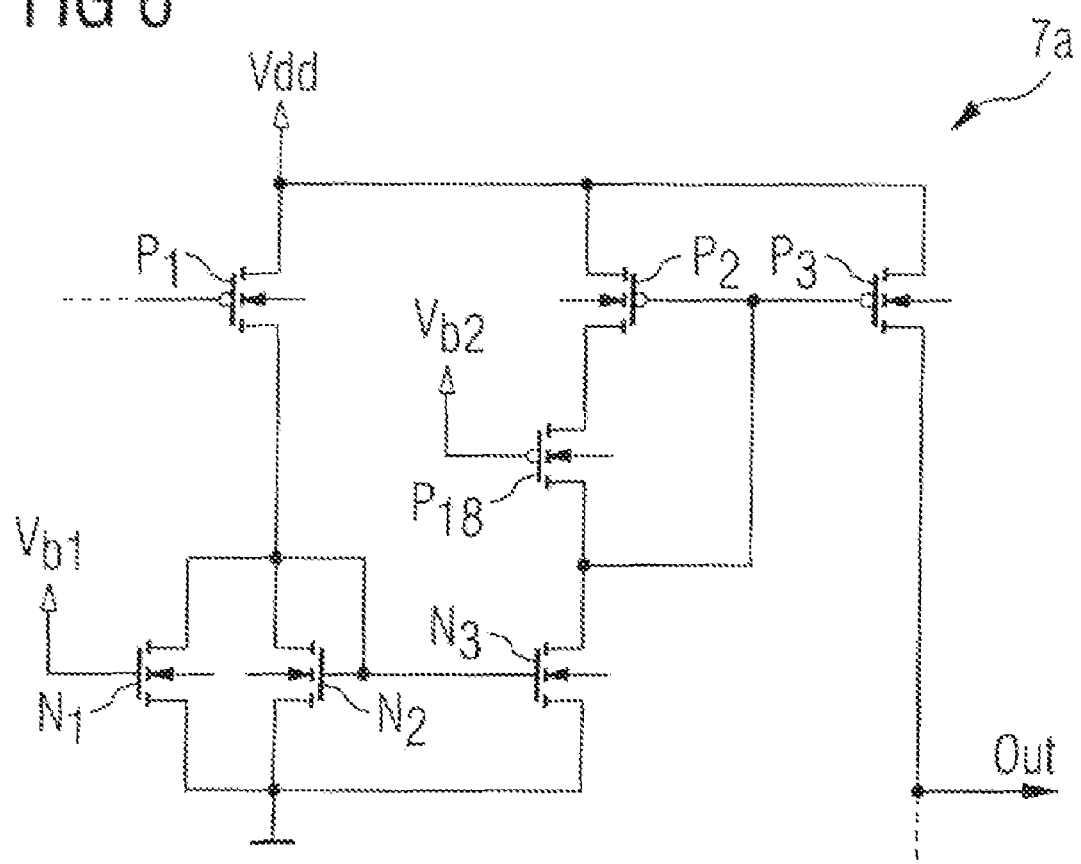
FIG. 6 shows a schematic illustration of the PMOS part of an output stage amplifier according to one embodiment of the invention with an additional cascode transistor.

Following the form of illustration in FIG. 4, FIG. 6 shows another embodiment of the output stage amplifier circuit according to the invention with an additional cascode transistor P18. Its other components are denoted in a manner corresponding to the notation in FIG. 4 and FIG. 5 and are not explained again in this example. The integrated cascode transistor P18 of the first conduction type with a fixedly set gate voltage Vb2 is connected between the two pairs of current mirror transistors, the source contact being connected to the drain contact of the transistor P2. In addition, the cascode transistor controls the output transistor P3 by means of a shunt path which connects the drain contact of P18 to the gate contacts of the transistors P2 and P3.

Figure 7:
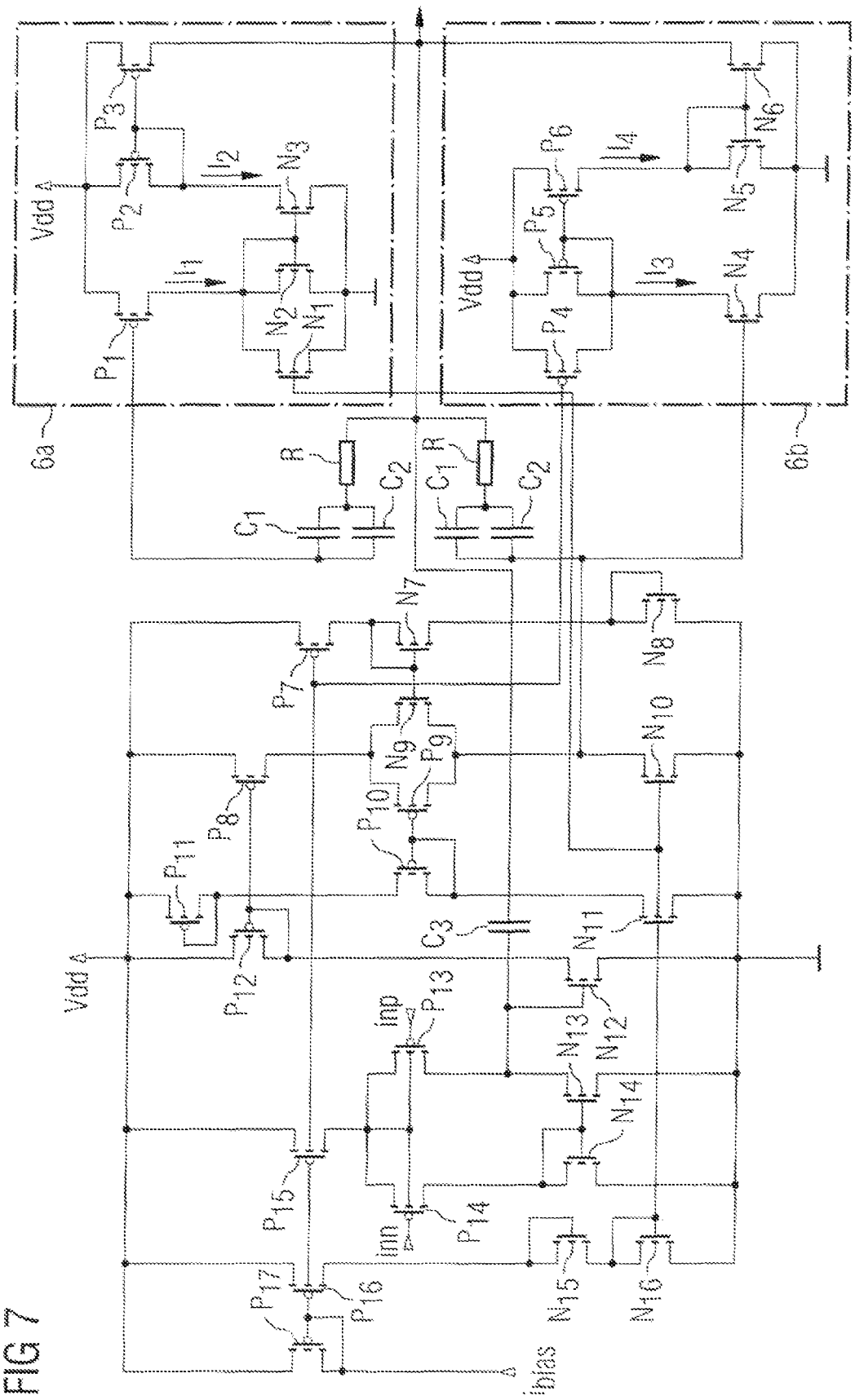
FIG. 7 shows a schematic illustration of a 3-stage Class AB feed forward amplifier with an output stage amplifier according to another embodiment of the invention.

The cascode transistor used in the amplifier circuit according to one embodiment of the invention compensates for the disadvantage of very large overhead currents which include the currents denoted I2, I2, I3 and I4 in FIG. 7. On account of the direct current mirroring, these currents would be proportional to the output current and must not be ignored during full operation where they could lead to a significant reduction in the bandwidth of the amplifier and thus to an increased switching time.

Figure 3:
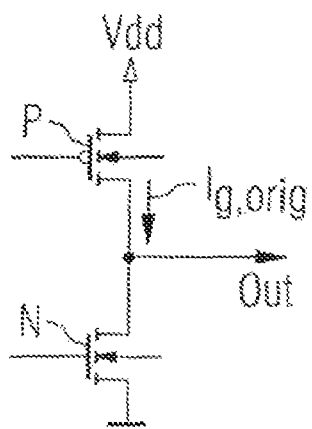
FIG. 3 shows an equivalent circuit diagram of a conventional output stage amplifier.

FIG. 7 shows the embodiment of a 3-stage Class AB feed forward amplifier having the output stage according to the embodiment from FIG. 4. The components of the PMOS part 6a are denoted in a manner corresponding to the notation in FIG. 4 and are not explained again in this case. A difference between this embodiment of the invention and the conventional amplifier output stages (FIG. 3) is that the signal which is applied to the transistor P1 is forwarded to a second current mirror circuit P2 and P3 via the first current mirror circuit N2 and N3, the second current mirror circuit comprising the output transistor and the first current mirror circuit comprising an additional component N1. The individual components are connected in a manner corresponding to FIG. 4.

For simplified analysis, the mirror ratio 1:N of the pairs of current mirror transistors N2-N3 and P2-P3 is assumed to be 1:5 and the DC component I12 which is passed via the shunt path is assumed to be 4/5 of the total DC current. This results in a DC gain of 1:5 from P1 to P3, whereas the gain of the AC component is 1:25, as a result of which the gain factor of an output stage according to the invention is 25 times greater than in a conventional output stage, the quiescent current required being increased only fivefold. If a gain factor gm equal to that of a conventional amplifier circuit (referred to as gm,orig below) is then desired in the amplifier circuit according to the invention, the gain at the pre-output transistor P1 must only be gm,orig/25. This results in the requisite quiescent current I1 also only having to be 1/25 of Iq,orig (quiescent current of a conventional amplifier circuit).

In order to calculate the total amount of quiescent current required, the requisite quiescent currents of the individual current paths, which are composed of the currents I1, I2 and the current via the output transistor P3 in the PMOS part 6a, are added. Since only 1/5 of the quiescent current I1 coming from the transistor P1 is passed to the transistor N2 of the first pair of current mirror transistors by the additional component N1 (I11=I1/5=Iq,orig/[5*25]) and said current is mirrored with a mirror ratio of 1:5, a value of Iq,orig/25 results for the requisite quiescent current I2. If this quiescent current is mirrored with the ratio 1:5 at the second pair of current mirror transistors P2-P3, a quiescent current of Iq,orig/5 results for the output transistor P3. A required amount of quiescent current or DC current of only 4/25 of that conventionally required thus results for the PMOS part of the output stage amplifier circuit according to the invention.

With the ratios assumed above and taking into account the NMOS part 6b of the output stage according to the invention, which has the same structure as the PMOS part, two additionally required quiescent currents I3 and I4 which, like I1 and I2, are ½s of the conventional quiescent current result. The transistor N6 which is complementary to the output transistor P3 does not have an additional quiescent current component since part of the quiescent current from P3 flows to it, thus resulting in a total quiescent current draw of the output stage amplifier according to the invention of Iq=$9/25$*Iq,orig.

The output stage amplifier according to the invention shows that, by adding two pairs of current mirror transistors and a transistor N1 which is connected in parallel with the first pair of current mirror transistors and which acts as a shunt path for the DC component but does not influence the AC characteristics of the circuit, the total AC component of the signal and only part of the DC component are mirrored and amplified, thus resulting in an AC gain without an increased quiescent current.

Figure 8:
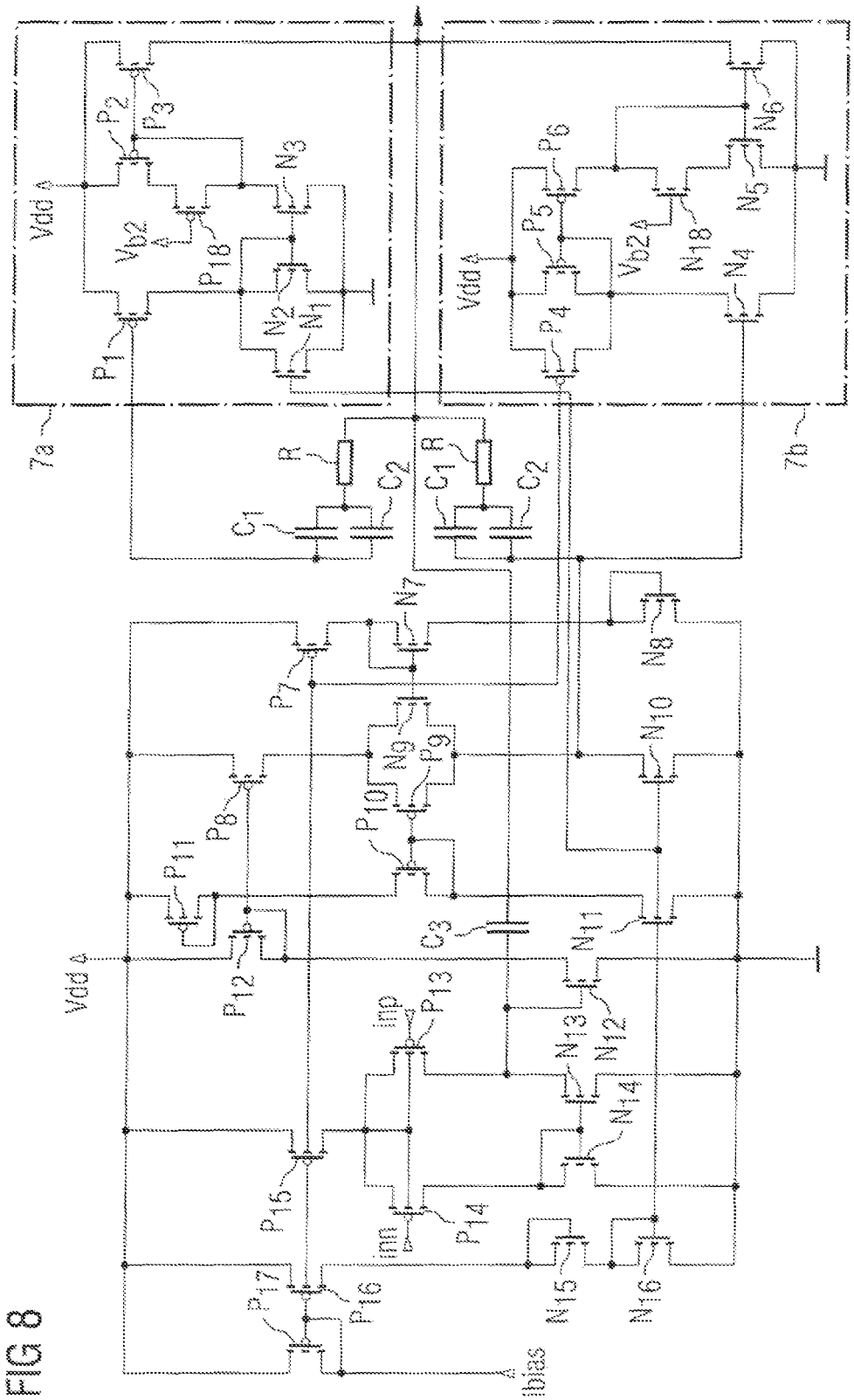
FIG. 8 shows a schematic illustration of a 3-stage Class AB feed forward amplifier with an output stage amplifier according to yet another embodiment of the invention and an additional cascode transistor.

FIG. 8 shows the embodiment of a 3-stage Class AB feed forward amplifier with the output stage according to the invention from FIG. 7 and an additionally inserted cascode transistor P18. In this case too, the notation of the components is selected following preceding FIGS. 4 to 7. The cascode transistor P18 which is connected between the pairs of current mirror transistors in the PMOS part 7a controls the output transistor P3 using its drain contact which is connected to the gate contacts of the transistors P2 and P3 via a shunt path. In a complementary manner to this, a cascode transistor of a second conduction type is likewise integrated in the NMOS part 7b between the pairs of current mirror transistors there.

Figure 9:
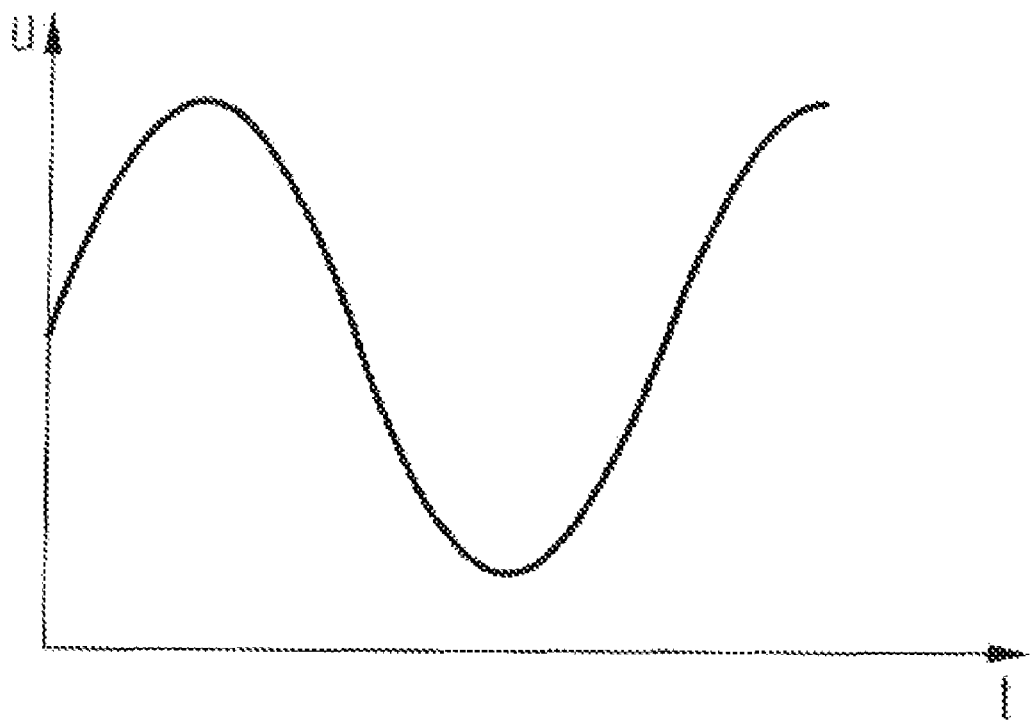
FIG. 9 shows a voltage and current diagram for an output stage amplifier according to one embodiment of the invention with and without a cascode transistor.
Figure 9:
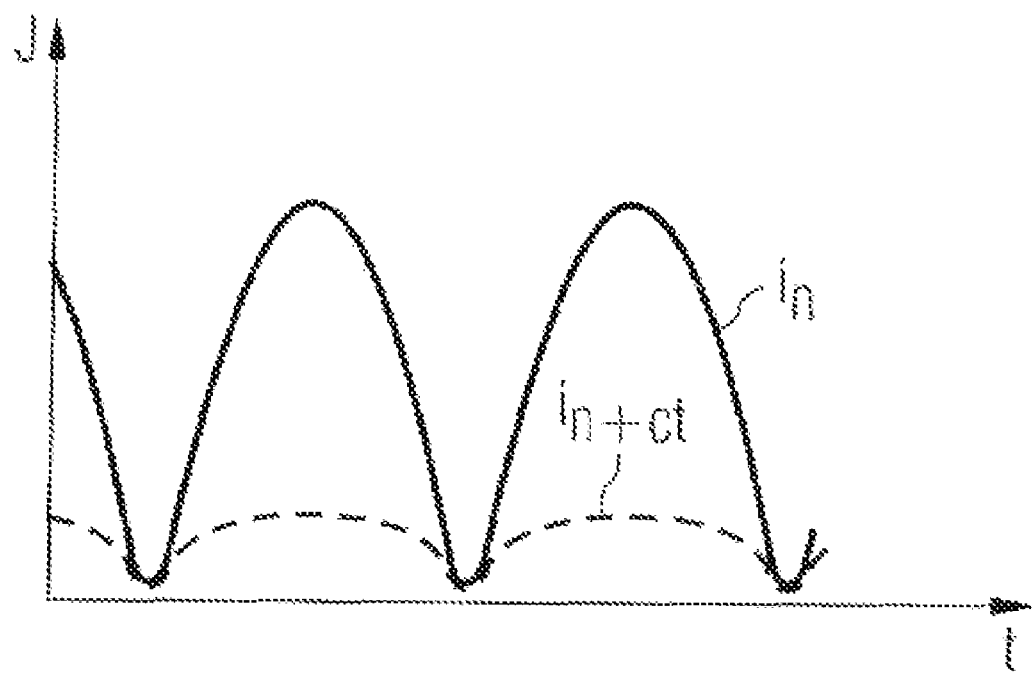

On account of the output stage amplifier according to the invention in FIG. 8, the current peak profiles of the output stage can be considerably improved by virtue of the fact that the overhead currents, which are denoted I1, I2, I3 and I4 in FIG. 7, can be effectively suppressed. As illustrated in FIG. 9, In denotes the overhead current profiles of the amplifier circuit according to the invention from FIG. 7 and $I_{n+ct}$ denotes the overhead current peak profiles of the amplifier circuit according to the invention from FIG. 8, the voltage profile being identical for both output stage amplifier circuits. It has been found that the current peaks of an amplifier circuit and thus also the intrinsic consumption during full operation can be effectively kept under control by adding the cascode transistors P18/N18 between the pairs of current mirror transistors.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

The invention claimed is:

1. An amplifier circuit, comprising:
   an output transistor configured to drive a complex load over a drive frequency range, wherein in a lower part of the range an inductive component of the load dominates, and in an upper part of the range the inductive component does not dominate;
   a current mirror circuit portion upstream of the output transistor; and
   a shunt path configured to reduce a DC current flowing through the output transistor without substantially affecting an AC current flowing through the output transistor.

2. The amplifier circuit of claim 1, wherein the amplifier circuit comprises an audio output amplifier configured to drive an electrodynamic loudspeaker.

3. The amplifier circuit of claim 2, wherein the audio amplifier comprises a Class AB amplifier.

4. The amplifier circuit of claim 1, wherein the current mirror circuit section portion comprises a first pre-output transistor and a second pre-output transistor and two pairs of current mirror transistors which are connected downstream of the pre-output transistors and connect the latter, and wherein one of the pairs of current mirror transistors includes the output transistor.

5. The amplifier circuit of claim 4, the output transistor and the first pre-output transistor comprising a first and a second MOS transistor of a first conduction type, and the second pre-output transistor comprising a first MOS transistor of a second conduction type, and wherein the current mirror circuit portion comprises a third MOS transistor of the first conduction type and a second and a third MOS transistor of the second conduction type.

6. The amplifier circuit of claim 1, further comprising an additional component configured to mirror a high current while suppressing a proportional increase in a flow of current through the current mirror circuit portion provided on a reference side of the current mirror circuit portion.

7. The amplifier circuit of claim 4, further comprising a cascode transistor comprising a source or emitter potential configured to control a switching function of the third MOS transistor of the first conduction type, wherein the cascode transistor is connected between the pairs of current mirror transistors.

8. The amplifier circuit of claim 7, wherein the cascode transistor comprises a fourth transistor of the first conduction type biased with a fixed gate voltage, and having a source potential that conducts to a gate of the third MOS transistor of the first conduction type.

9. The amplifier circuit of claim 1, wherein the amplifier circuit comprises an output portion of a multistage Class AB amplifier circuit.

10. The amplifier circuit of claim 1, wherein the amplifier circuit comprises an output portion of a multistage feed forward amplifier circuit.

11. The amplifier circuit of claim 1, wherein the shunt path is further configured to reduce the DC current flowing through the output transistor by diverting therethrough a portion of the DC current flowing through the current mirror circuit portion.

12. An amplifier circuit, comprising:
   a first current mirror circuit configured to receive a first current and generate a second, mirrored current in response thereto;
   a second current mirror circuit configured to receive the second current and generate a third, mirrored current in response thereto; and a current diversion circuit configured to receive an input signal and divert solely a portion of a DC current associated with the input signal, thus reducing the input signal to the first current comprising an AC component and a reduced DC component.

13. The amplifier circuit of claim 12, wherein the current diversion circuit comprises a current source circuit configured to sink the diverted DC current portion associated with the input signal.

14. The amplifier circuit of claim 13, wherein the current source circuit comprises a MOS transistor having a substantially constant gate bias applied thereto.

15. The amplifier circuit of claim 12, wherein the second current mirror circuit comprises:

a cascode transistor coupled between the first current mirror circuit and the transistor pair, and having an input node thereof coupled to both the first current mirror circuit and the gate terminals of the transistor pair.

16. An amplifier circuit, comprising:

a first current mirror circuit configured to receive a first current and generate a second, mirrored current in response thereto;

a second current mirror circuit configured to receive the second current and generate a third, mirrored current in response thereto; and means for diverting a portion of a DC current component from an input signal to form the first current comprising an AC component and a reduced DC component.

17. The amplifier circuit of claim 16, wherein the diverting means comprises a current source circuit configured to sink the diverted DC current portion associated with the input signal.

18. The amplifier circuit of claim 17, wherein the current source circuit comprises a MOS transistor having a substantially constant gate bias applied thereto.

* * * * *